United States Patent
Hong et al.

(10) Patent No.: US 8,541,289 B2
(45) Date of Patent: Sep. 24, 2013

(54) DICING DIE BONDING FILM AND DICING METHOD

(75) Inventors: Jong Wan Hong, Daejeon (KR); Jang Soon Kim, Daejeon (KR); Hyo Soon Park, Daejeon (KR); Hyun Jee Yoo, Daejeon (KR); Dong Han Kho, Daegu (KR); Hyo Sook Joo, Anyang-si (KR)

(73) Assignee: LG Chem, Ltd., Seoul (KR)

( * ) Notice: Subject to any disclaimer, the term of this patent is extended or adjusted under 35 U.S.C. 154(b) by 56 days.

(21) Appl. No.: 12/681,572

(22) PCT Filed: Oct. 15, 2008

(86) PCT No.: PCT/KR2008/006081
§ 371 (c)(1),
(2), (4) Date: Jul. 28, 2010

(87) PCT Pub. No.: WO2009/072742
PCT Pub. Date: Jun. 11, 2009

(65) Prior Publication Data
US 2010/0291739 A1    Nov. 18, 2010

(30) Foreign Application Priority Data

Dec. 3, 2007  (KR) .......................... 10-2007-0124321

(51) Int. Cl.
*H01L 21/00* (2006.01)
(52) U.S. Cl.
USPC ........................................................ 438/464
(58) Field of Classification Search
USPC ........................................................ 438/464
See application file for complete search history.

(56) References Cited

U.S. PATENT DOCUMENTS

| | | | |
|---|---|---|---|
| 6,444,310 B1 | 9/2002 | Senoo et al. | |
| 7,768,141 B2 * | 8/2010 | Seo et al. | 257/790 |
| 2009/0170290 A1 * | 7/2009 | Maki et al. | 438/464 |

FOREIGN PATENT DOCUMENTS

| | | |
|---|---|---|
| JP | 2003-171475 | 6/2003 |
| JP | 2005-235795 | 9/2005 |
| JP | 2006-005159 | 1/2006 |
| JP | 2007-005436 | 1/2007 |
| JP | 2007-109808 | 4/2007 |
| KR | 10-2000-0017190 | 3/2000 |
| KR | 10-2006-0046-464 | 5/2006 |
| KR | 10-2006-0046464 | 5/2006 |

* cited by examiner

*Primary Examiner* — Jenny L Wagner
(74) *Attorney, Agent, or Firm* — McKenna Long & Aldridge, LLP (57) ABSTRACT

The present invention relates to a dicing die bonding film, which is able to maintain good workability and reliability in any semiconductor packaging process, such as adhesive property, gap filling property and pick-up property, while controlling burr incidence in a dicing process and thus contamination of die, and a dicing method. Specifically, the present invention is characterized by optimizing tensile characteristics of the dicing die bonding film, or carrying out the dicing on the parts of the die bonding film in the dicing process and separating it through an expanding process. Therefore, the present invention may regulate physical properties of films so as to have the maximized adhesive property, pick-up property and gap filling property without any specific restriction, while controlling burr incidence in the dicing process and contamination of die. As a result, workability and reliability in a packaging process may be excellently maintained.

11 Claims, 4 Drawing Sheets

DICING DIE BONDING FILM AND DICING METHOD

This application claims the benefit of PCT/KR2008/006081 filed on Oct. 15, 2008 and Korean Patent Application No. 10-2007-0124321 filed on Dec. 3, 2007, all of which are hereby incorporated herein by reference for all purposes in their entirety.

TECHNICAL FIELD

The present invention relates to a dicing die bonding film, which is able to maintain good workability and reliability in any semiconductor packaging process, such as adhesive property, gap filling property and pick-up property, while controlling burrs incidence in a dicing process and thus contamination of die, and a dicing method.

BACKGROUND ART

Generally, a process for preparing a semiconductor chip comprises a process for forming fine patterns on a wafer and a process for packaging the wafer after polishing it, so as to meet standards of the final device.

Here, the process for packaging comprises a step of wafer inspecting, wherein a semiconductor chip is inspected for defectives; a step of dicing, wherein a wafer is cut to separate into each chip; a step of die bonding, wherein the separated chip is attached to a circuit film or a loading plate of a lead frame; a step of wire bonding, wherein circuit patterns of the circuit film or the lead frame are connected to chip pads provided on the semiconductor chip, with an electrical connecting means such as a wire; a step of molding, wherein the outside of the semiconductor chip is surrounded with a sealant to protect interior circuits of it and the other parts; a step of trimming, wherein a dambar connecting a lead to a lead is cut; a step of forming, wherein the lead is bent into the desired shape; and a step of finished product inspecting, wherein the finished package is inspected for defectives.

Furthermore, in said step of dicing, the wafer is cut in a certain thickness with a diamond wheel, and the like. Here, to fix the wafer, an adhesive film for dicing die bonding is laminated on the back side of the wafer, on which patterns are not formed, under an appropriate temperature condition. However, in case of performing the step of dicing under said condition, an excessive pressure or a mechanical impact is applied thereto to cause chippings due to the wafer damage, and burrs which are able to cause contamination of patterns. At a recent while the thickness of wafer become thinned due to a small size of the packaging and the dicing conditions become severe for increase of production efficiency, said problems frequently happen. Especially, while the thickness of wafer become thinned, there are many cases in which even burrs having a level without any problem formerly, climb onto a die, and they cause defectives of the semiconductor chip by contaminating the patterns.

Most conventional techniques for decreasing such burr incidence were almost methods for regulating physical properties of dicing films and die bonding films. However, in case of changing physical properties of said films to reduce the incidence of burrs, there is relatively a limit to physical properties such as reliability in die bonding process or dicing process.

Japanese Unexamined Patent Publication No. 2007-19478 discloses a method for carrying out dicing as a technique which prevents to scatter wafer fragments without practicing back grinding in the dicing, in which a dicing depth is controlled in each part of wafer and height of a dicing blade is slowly changed (ascended) in specific parts.

However, in the method disclosed in said prior document, dicing is carried out to the base film of the dicing film as the conventional dicing methods. In this case, the expanding and pick-up step are carried out in a condition that the die bonding film, being major component of burrs, is completely cut. Here, there is a problem to cause contamination of die, since burrs of the die bonding film having relatively weak adhesion strength are scattered over die.

DISCLOSURE

Technical Problem

The present invention has been made to solve the problems of the prior art as described above, and an object of the invention is to provide a dicing die bonding film, which is able to maintain good workability and reliability in any semiconductor packaging process, such as adhesive property, gap filling property and pick-up property, while controlling burr incidence in a dicing process and thus contamination of die, and a dicing method.

Technical Solution

As means for solving said problem, the present invention provides a dicing die bonding film comprising a dicing film; and a die bonding film, formed on said dicing film, having a tensile modulus of 10 to 2,000 MPa at 25° C.

In said dicing die bonding film of the present invention, an elongation of the dicing film is preferably in a range of 100 to 2,000%, and more preferably in a range of 500 to 1,500%.

As another means for solving said problem, the present invention also provides a method of dicing using a dicing die bonding film comprising a dicing film having a base film and comprising a pressure sensitive adhesive layer formed on said base film; and a die bonding film formed on said dicing film, and comprising a first step of adhering a wafer on the die bonding film; a second step of carrying out dicing to a depth that the die bonding film is not completely cut; and a third step of expanding the dicing die bonding film to completely separate the die bonding film.

Preferably, the method of dicing according to the present invention is carried out by using the dicing die bonding film of the present invention as previously described.

In addition, in the second step of the method of dicing according to the present invention, the dicing is preferably accomplished to a level of 50 to 99%, and more preferably 75 to 95%, of the die bonding film thickness.

Furthermore, it is preferred that in the third step of the method of dicing according to the present invention, the expanding strength is a level of 60 to 90% of the yield strength of the base film in the dicing film.

Preferably, in the step of expanding of the method of dicing according to the present invention, the expanding ratio is controlled beyond the yield elongation of the base film in the dicing film and said ratio is controlled below the tensile strain at the beginning point that the tensile strength again increases after the yield point in a tensile curve of the base film in the dicing film.

As the other means for solving said problem, the present invention also provides a method of dicing using a dicing die bonding film comprising a dicing film having a polyolefin film and a pressure sensitive adhesive layer formed on said polyolefin film; and a die bonding film formed on said dicing film, and comprising a first step of adhering a wafer on the die bonding film; a second step of carrying out wafer dicing to a depth that the die bonding film is not completely cut; and a third step of expanding the dicing die bonding film to completely separate the die bonding film.

In said method of dicing, it is preferred that the expanding strength in the third step is 600 to 1,350 gf.

Furthermore, in said method of dicing, it is preferred that the expanding ratio in the third step is 8 to 30%.

Advantageous Effects

According to the dicing die bonding film and the dicing method of the present invention, burr incidence in dicing process may be reduced and physical properties of films may be regulated so as to maximize adhesive property, pick-up property and gap filling property without a certain limitation, so that workability and reliability in any semiconductor packaging process may be excellently maintained.

DESCRIPTION OF REFERENCES IN DRAWINGS

1: dicing film
1-1: base film
1-2: pressure sensitive adhesive layer
2: die bonding film
3: wafer
4: dicing blade
A: dicing depth in die bonding film
B: remaining depth after dicing
C: dicing width

BEST MODE

The present invention relates to a dicing die bonding film comprising a dicing film; and a die bonding film, formed on said dicing film, having a tensile modulus of 10 to 2,000 MPa at 25° C. The present invention is characterized by optimizing tensile characteristics of the dicing die bonding film. The term, "tensile characteristics," means the characteristics of a specimen (for example, die bonding film, etc.) which is represented by a relationship (tensile curve) of stress and distortion curves at break after fixing both ends of the specimen and applying stress axially thereto. According to the dicing die bonding film of the present invention, workability and reliability in any semiconductor packaging process, such as adhesive property, gap filling property and pick-up property, may be excellently maintained. The dicing die bonding film of the present invention may be efficiently used in the following dicing method of the present invention.

Hereinafter, the dicing die bonding film of the present invention is explained in more detail.

The present invention is characterized by controlling a tensile modulus of the die bonding film in a range of 10 to 2,000 MPa at 25° C. Here, the tensile modulus is a value when the film was performed with a tensile test having a tensile rate of 12.8 mm/min at 25° C. Specifically, in the present invention a specimen is prepared by cutting a film in a size of 50 mm×10 mm (length×width), such that the longitudinal direction is the coating direction in a process for preparing the film, and both ends of said specimen are taped such that only 25 mm remains in the longitudinal direction. And then a tensile modulus is measured by holding and elongating said parts at a speed of 12.8 mm/min. If the measured modulus is less than 10 MPa, the film is not clearly cut in the expanding step of the following method of dicing, and thus it is apprehended that the pick-up step is not run smoothly. If it is more than 2,000 MPa, many film powders are generated at break, and thus it is apprehended that patterns of die are contaminated.

The present invention is characterized by controlling the tensile modulus of the die bonding film as above, and in some cases, the tensile characteristics of the dicing film may be further controlled. Specifically, the dicing film herein is controlled to have an elongation of preferably 100 to 2,000%, and more preferably 500 to 1,500%. Here, the elongation is a value when the film was performed with a tensile test having a tensile rate of 300 mm/min at 25° C. Such specific method of measuring an elongation is similar to said method of measuring a tensile modulus of the die bonding film except for the tensile rate, and the like. If said elongation is less than 100%, it is apprehended that a film is easily torn in the expanding step of the following dicing method. If it is more than 2,000%, it is apprehended that the film sags overall.

By regulating the tensile characteristics of the dicing film and/or the die bonding film herein as above, burr incidence and die contamination in the dicing process may be inhibited, and moreover said film may be applied to the following dicing method of the present invention to obtain maximized effects.

Materials composing said dicing die bonding film of the present invention and methods of preparing the same are not specifically restricted, and the present film may be freely embodied by any ordinary technician in this field without particular difficulty. For example, the dicing die bonding film of the present invention may be prepared by preparing a die bonding film and a dicing film, respectively, through the method comprising:

a first step of dissolving or dispersing a resin composition in a solvent to prepare a resin varnish;

a second step of applying said resin varnish on a base film; and a third step of heating said base film, on which the resin varnish is applied, to remove the solvent, and then laminating them.

The first step is a step of preparing a resin varnish using a resin composition. Here, materials composing the resin composition are not specifically restricted, and those usually used in this field may be applied without any restriction. For example, materials for pressure sensitive adhesive layers of the dicing film include high molecular weight thermoplastic resins such as acrylic resins which may be subjected to pressure sensitive adhesion at normal temperature, and have high cohesive attraction and modulus. Generally, UV type or non-UV type (for example, thermosetting type) layers are used as the pressure sensitive adhesive layer of the dicing film, depending on thickness and use of wafers to be processed, and said layers may be each prepared by using UV cure type pressure sensitive adhesives or thermosetting type pressure sensitive adhesives, and the like. Here, in case of the UV type, the cohesive attraction of the pressure sensitive adhesive is increased via UV irradiation to lower the adhesion strength, and in case of the non-UV type (for example, thermosetting type), the adhesion strength is lowered by applying heat and the like. Such UV type and non-UV type films make a difference in peel force when the diced wafer fragments are picked up after the dicing process. That is, non-UV type films have relatively higher adhesion strength than UV type cases, and thus, if the wafer is thinned, it is apprehended to cause defectives on picking up. Therefore, as the thickness of wafers is thinned now, the UV type dicing films having low adhesion strength are principally used. It is preferred herein to use UV type pressure sensitive adhesives, but not limited to these.

As adhesive layers of die bonding films, high molecular weight thermoplastic resins may be used in view of elasticity and initial adhesive characteristics, or thermosetting resins may be used in view of bond strength at high temperature and heat resistance. An example of representative compositions which may be used in the adhesive layers includes a composition comprising a multi-functional epoxy resin, a hardener and a thermosetting resin. It is preferred to use a phenol resin as said hardener, and to use one whose moisture absorptivity is 2.0% by weight or less on treating it by PCT (Pressure Cooker Test: 121° C./100%/2 atm) for 48 hours, in view of moisture resistance at high temperature. In addition, said thermoplastic resins include compounds having functional groups such as glycidyl group, hydroxy group, carboxyl group and/or nitrile group, for example, acrylic resins comprising monomers such as glycidyl (meth) acrylate, hydroxy (meth)acrylate and/or carboxyl (meth)acrylate. Although said materials show examples which may be used herein, respectively, the present invention is not limited to them on preparing films according to the present invention, and usual materials in this field may be used without any restriction.

As said varnishing solvent, one or more selected from the group consisting of methylethyl ketone (MEK), acetone, toluene, dimethylformamide (DMF), methylcellosolve (MCS), tetrahydrofuran (THF) and N-methylpyrrolidone (NMP) are used.

In order to shorten process time or improve dispersibility in the film, fillers may be used in said first step. Examples of usable fillers may include ball mill, bead mill, three rolls or high speed disperser alone or in a combination of two or more thereof. Balls or beads are made from glass, alumina or zirconium, and the like. In view of dispersibility of particles, the balls or beads made from zirconium are specifically preferred.

Said second step is a step of applying the prepared resin varnish on the base film. A method of applying the resin varnish on said base film is not particularly limited. For example, methods usually known in this field, such as knife coat, roll coat, spray coat, gravure coat, curtain coat, comma coat and/or lip coat method, may be used. The base film used in said step is not also particularly limited. For example, usual materials in this field, such as a polyethylene film, a polypropylene film, a polytetrafluoroethylene film, a polyethyleneterephthalate film, a polyurethane film, an ethylene vinyl acetate film, an ethylene-propylene copolymer film, an ethylene-acrylic acid ethyl copolymer film, ethyl copolymer film or an ethylene-acrylic acid methyl copolymer film, and the like may be used. If necessary, said base film may be subjected to surface treatment such as primer application, corona treatment, etching treatment or UV treatment, and selected from one having good optical transparency for curing with UV irradiation.

Said third step is a step of removing the solvent by heating the applied base film, wherein heating is preferably performed at 70 to 250° C. for about 5 to 20 minutes, but not limited to this.

After the dicing film and the die bonding film are prepared by the above method, they are laminated to prepare the dicing die bonding film. Here, the prepared dicing film and die bonding film are laminated by a method such as hot roll laminate or laminate press. The hot roll laminate method is specifically preferred in view of capability of continuous processes and efficiency, and said method is preferably performed in a condition having a temperature of 10 to 100° C. and a pressure of 0.1 to 10 Kgf/cm$^2$, but not limited to this.

Figure 1:
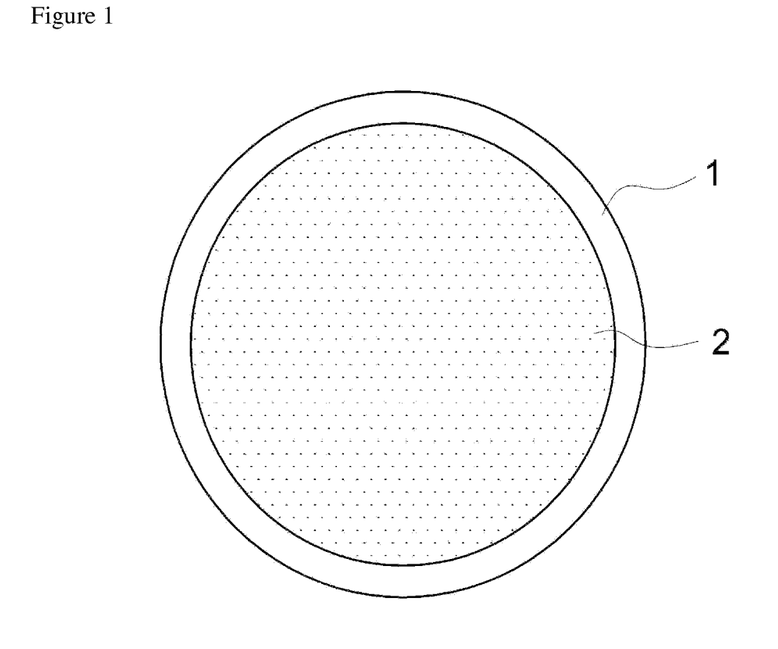
FIG. 1 is a view showing an adhesive film according to one aspect of the present invention, in which a die bonding film is laminated on a dicing film.

As shown in FIG. 1, the present invention also relates to a method of dicing using a dicing die bonding film comprising a dicing film (1) having a base film and a pressure sensitive adhesive layer formed on said base film; and a die bonding film (2) formed on said dicing film, and comprising a first step of adhering a wafer on the die bonding film; a second step of carrying out dicing to a depth that the die bonding film is not completely cut; and a third step of expanding the dicing die bonding film to completely separate the die bonding film. When the dicing process of semiconductor packaging is accomplished by said method herein, physical properties of dicing films and die bonding films may be widely regulated, and the present invention may provide the dicing die bonding film having excellent workability and reliability such as adhesive property, pick-up property and gap filling property, with inhibiting burr incidence in a dicing process. If physical properties of films are regulated for only workability and reliability without considering die contamination and burr incidence, film characteristics may be more excellently embodied. However, to reduce burr incidence of films, the modulus must be maintained more than a certain level. Due to such restriction, adhesive property and gap filling property are lowered in the die bonding process. That is, when the amount of inorganic filler is increased in general to regulate the modulus of films, adhesive property to a wafer is lowered, so that chip flying and pick-up defective are caused. In addition, when gap filling property is lowered because of high amount of inorganic filler and modulus, it is apprehended that apertures between a substrate, such as PCB (Printed Circuit Board) and lead frame, and a die bonding film are caused, and thus there is a problem in reliability of packages.

However, in case of the method of dicing proposed in the present invention, gap filling property after die bonding may be maximized, without restricting physical properties such as modulus of films. In general packaging process, the gap filling property of a substrate with a die bonding film becomes 100% via die bonding and molding processes, but the physical properties of films according to the present invention may be regulated such that the gap filling property of a substrate after die bonding becomes 100%. Without being not particularly limited, it is preferred that the dicing die bonding film of the present invention as described above is applied to the method of dicing of the present invention.

Hereinafter, each step of the method of dicing according to the present invention is explained in more detail, with reference to the attached drawings.

Figure 2:
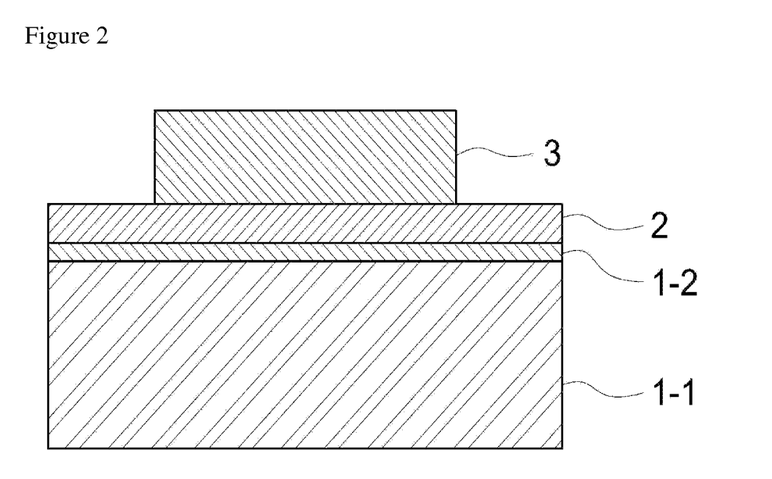
FIG. 2 is a view showing a shape that a wafer is adhered on the adhesive film of said FIG. 1.

As shown in FIG. 2, the first step of the present invention is a step of adhering a wafer (3), which is diced, on the die bonding film (2). Here, the method of attaching the wafer (3) is not particularly limited, and it may be adhered by a method usually used in this field.

Figure 3:
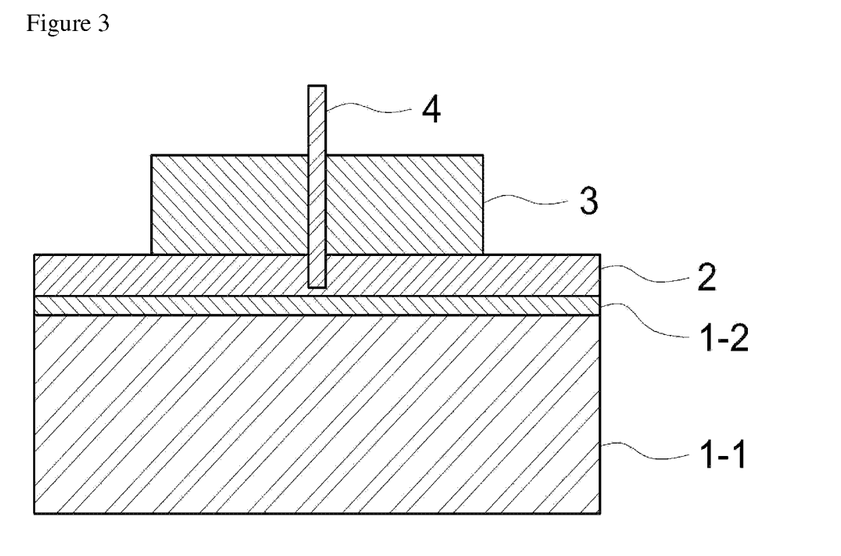
FIG. 3 is a pattern diagram showing a shape that the die bonding film is cut partially by a dicing blade in the method of dicing according to one aspect of the present invention.
Figure 4:
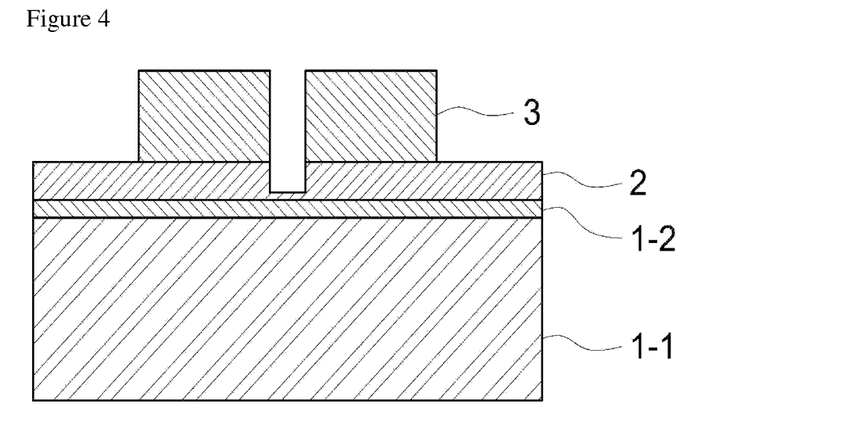
FIG. 4 is a sectional view after partial cutting according to FIG. 3.
Figure 5:
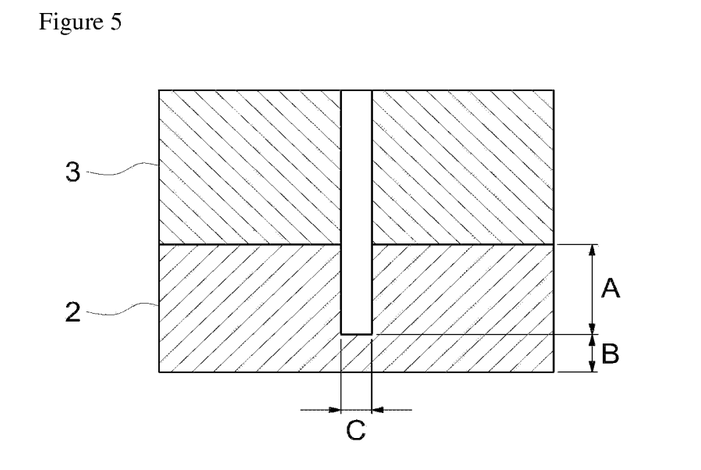
FIG. 5 is a sectional view enlarging portion of the die bonding film and the wafer in FIG. 4.
Figure 6:
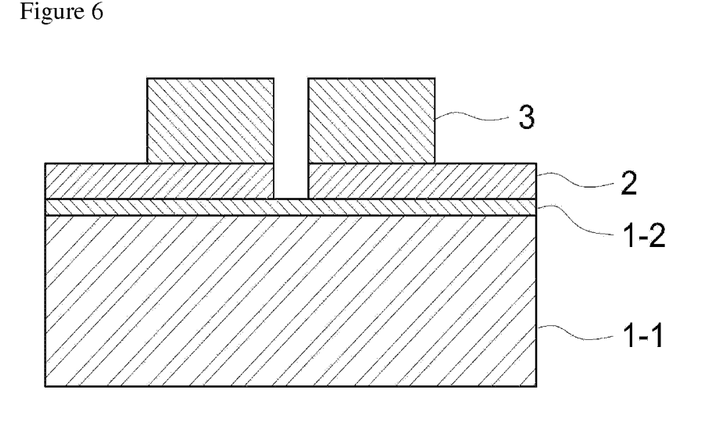
FIG. 6 is a pattern diagram showing a shape that the die bonding film is completely separated by expanding the partially cut film.

The second step of the present invention is a step of dicing the film, on which the wafer (3) is adhered, to prepare semiconductor chips. As shown in the attached FIG. 3, the present invention is characterized by controlling the dicing depth to a depth that the die bonding film (2) is not completely cut. The attached FIG. 4 is a view showing a shape that the dicing blade (4) is removed after carrying out the dicing according to the method of the present invention, and FIG. 5 is a sectional view enlarging parts of the wafer (3) and the die bonding film (2) in FIG. 4. Specifically, the dicing depth in said second step is determined depending on thickness of the die bonding film. As the die bonding film is thicker, more cutting should be accomplished. Without being particularly limited, the wafer dicing in said second step is accomplished preferably to 50 to 99%, and more preferably to 75 to 95%, of the die bonding film thickness. If said dicing depth is less than 50% of the die bonding film thickness, it is apprehended that the film is not completely separated in the step of expanding. If it is more than 99%, it is apprehended that a part of dicing film is cut to cause burrs, due to process margin.

The third step of the present invention is a step of expanding the dicing die bonding film to completely separate the die bonding film which is partially cut. The expanding step is a process extending the interval of the cut die such that the pick-up step as normally followed may be run smoothly, wherein the dicing die bonding film attaching the cut wafer is elongated in all directions (360 degrees).

In the expanding process of the method of dicing according to the present invention, the expanding property is lowered as compared with the conventional process. That is, in the conventional process, expanding is easily performed in a condition that the base film of the dicing film is partially cut, but in the present invention, the cutting part of the whole film is reduced as compared with the conventional process, so that the expanding property is relatively lowered. Therefore, to run the expanding process smoothly, it needs to regulate tensile characteristics of films, or to appropriately control the expanding conditions depending on the tensile characteristics. In the present invention the third step of expanding is characterized by regulating the expanding strength and the expanding ratio depending on tensile characteristics (tensile curve) of the base film in the dicing film. The specific test conditions concerning tensile characteristics of said base film in the dicing film are the same as previously described (tensile speed: 300 mm/min). When the tensile curve which shows tensile characteristics is depicted, Y axis represents a stress applied to a specimen, and X axis represents a ratio (tensile strain, %) that the specimen is deformed by the stress. Hereinafter, the term used herein, "expanding strength," means a stress applied to the dicing die bonding film in expanding, and corresponds to Y axis of a tensile curve. In addition, the term used herein, "expanding ratio," means a deformation ratio that the dicing die bonding film is extended in expanding, and corresponds to X axis of the tensile curve.

It is preferred that the expanding strength in the third step of the method of dicing according to the present invention is a level of 60 to 90% of the yield strength of the base film in the dicing film. If said expanding strength is less than 60%, it is apprehended that the film sags overall. If it is more than 90%, it is apprehended that the film is torn.

In the third step of the present invention, it is preferred to control an expanding ratio of the dicing die bonding film beyond yield elongation of the base film in the dicing film. The term, "yield elongation," means a tensile strain at the yield point in the tensile curve of the base film in the dicing film. In addition, it is preferred that said expanding ratio of the dicing die bonding film is lower than the tensile strain at the point that the tensile strength value again increases after the yield point in the tensile curve of the base film in the dicing film. If said ratio is less than the yield point of the base film in the dicing film, the film has stability in expanding, and thus it is apprehended that by acting force due to contraction on the whole film, chips are scattered in picking up, or defectives are caused. In addition, if the expanding ratio is beyond the point that the tensile strength value again increases in the tensile curve, the secondary load is applied to the expanding equipment to cause shaking of the wafer, and it is apprehended that defectives such as chip flying are caused.

In the method of dicing according to the present invention, the specific conditions in each step are determined depending on thickness of the die bonding film and/or tensile characteristics of the base film in the dicing film. Therefore, the method of dicing according to the present invention has an advantage that it is available regardless of kinds of materials to be used. For example, when a polyolefin film is used as a base film in the dicing film, one aspect of an embodiment according to the present invention is as follows.

That is, the present invention relates to a method of dicing using a dicing die bonding film comprising a dicing film having a polyolefin film and a pressure sensitive adhesive layer formed on said polyolefin film; and a die bonding film formed on said dicing film, and comprising:

(1) a step of adhering a wafer, on the die bonding film;

(2) a step of carrying out wafer dicing to a depth that the die bonding film is not completely cut; and (3) a step of expanding the dicing die bonding film to completely separate the die bonding film.

Figure 7:
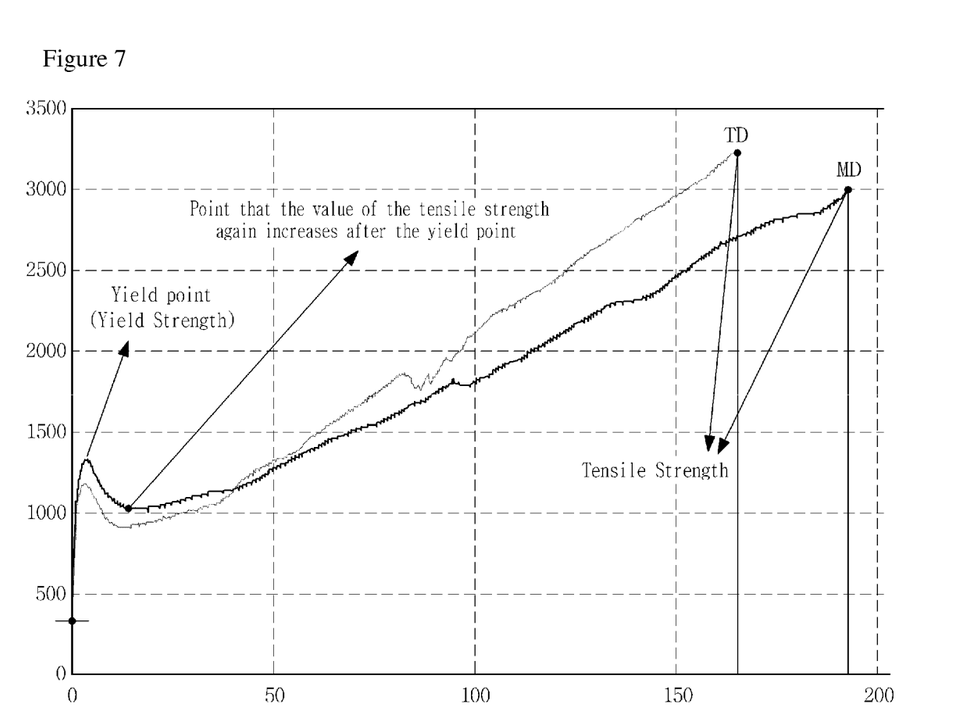
FIG. 7 is a view showing a tensile curve of a polyolefin film.

Said polyolefin film is a material which is most frequently used as a base film of the dicing film, and whose tensile curve is the same as the attached FIG. 7. In the drawing, MD (Mechanical Direction) means a coating direction in preparing, and TD (Transverse Direction) means a vertical direction to said MD. As shown in FIG. 7, said polyolefin film has yield strength of about 1,000 to 1,500 gf, a tensile strength of about 2,800 to 3,300 and an elongation of about 1,000% at a tensile speed of 300 mm/min.

When the method of the present invention is performed using such a dicing film, the specific conditions in each step are as follows.

That is, in said steps (1) and (2), a wafer is prepared, and the dicing is carried out to a depth that the die bonding film is not completely cut, preferably to a level of 50 to 99% of the die bonding film thickness, and more preferably to a level of 75 to 95%. Following said steps, the step of expanding is carried out, wherein an expanding strength is preferably 600 to 1,350 gf, a level of 60 to 90% of the yield strength of the base film (polyolefin film) in the dicing film. In addition, at this time, it is preferred to control the deformation ratio of polyolefin film beyond a yield elongation (about 8 to 12%, see FIG. 7) and below a tensile strain at the point that the tensile strength again increases after the yield point (about 25 to 30%, see FIG. 7).

The present invention also relates to a method of packaging a semiconductor comprising (1) a step of picking up the separated semiconductor chip from the previously described method of dicing;

(2) a step of bonding the picked-up semiconductor chip to a substrate for semiconductor;

(3) a step of connecting the semiconductor chip to the substrate for semiconductor with an electric connecting means; and (4) a step of molding the prepared package with a sealant.

The specific conditions of said semiconductor packaging method are not particularly limited, and conditions for pick-up process, die bonding process, wire bonding process and molding process as generally carried out may be adapted, without any restriction.

The dicing die bonding film and the dicing method as previously described provide excellent workability and reliability in semiconductor packaging process and may be efficiently applied to preparing various semiconductor devices. Examples of said semiconductor devices may include flash memory or semiconductor memory loaded in cellular phones or mobile terminals. Recently, said semiconductor devices are prepared in a manner of MCP (Multi Chip Package) that multi chips are laminated on a substrate for semiconductor to comply with requirements of high integration and high function. The film and method of the present invention may show excellent workability and reliability even in cases of such MCP manner.

MODE FOR INVENTION

Hereinafter, the present invention is explained in more detail through examples according to the present invention and comparative examples not according to the present invention. However, the scope of the present invention is not restricted to the represented examples below.

Example 1

A composition containing 66 parts by weight of an aromatic-based epoxy resin (novolac type epoxy resin, softening point 80° C.), 60 parts by weight of a phenol resin (phenol novolac resin, softening point 90° C.), 200 parts by weight of an acrylic copolymer containing epoxy group (SA-55, manufactured by LG Chem, Ltd., Tg=9° C., weight average molecular weight 500,000), 0.3 parts by weight of a hardening accelerator (2-phenyl-4-methyl imidazole (2P4MZ) and 15 parts by weight of silica (melted silica, average particle diameter 75 nm), was stirred and mixed in methyl ethyl ketone to prepare a varnish.

The prepared varnish was applied on a base film having a thickness of 38 μm (Release Polyester Film, RS-21G, manufactured by SKC), and dried at 110° C. for 3 minutes to prepare a film having a film thickness of 20 μm. The prepared film was cut in a size of 50 mm×10 mm (length×width), such that the longitudinal direction is the coating direction in preparing, to prepare a specimen, and then both ends of said specimen were taped such that only 25 mm remained in the longitudinal direction. Subsequently, the taped parts were held and elongated at a speed of 12.8 mm/min at normal temperature (25° C.) to measure a tensile modulus. The thus measured tensile modulus of film at normal temperature was 450 MPa. On the die bonding film prepared as above, a dicing film having a base film with a thickness of 100 μm and a pressure sensitive adhesive layer with a thickness of 10 μm was laminated, and cut to prepare a dicing die bonding film.

Example 2

A dicing die bonding film was prepared by the same method as Example 1 except that an acrylic resin was used in an amount of 100 parts by weight. Here, the die bonding film had a tensile modulus of 900 MPa.

Example 3

A dicing die bonding film was prepared by the same method as Example 1 except that an acrylic resin was used in an amount of 400 parts by weight. Here, the die bonding film had a tensile modulus of 200 MPa.

Comparative Example 1

A dicing die bonding film was prepared by the same method as Example 1 except that an acrylic resin was used in an amount of 30 parts by weight. Here, the die bonding film had a tensile modulus of 3,000 MPa.

Comparative Example 2

A dicing die bonding film was prepared by the same method as Example 1 except that an acrylic resin was used in an amount of 600 parts by weight. Here, the die bonding film had a tensile modulus of 10 MPa.

Comparative Example 3

The dicing depth in the dicing process was regulated from the dicing die bonding film prepared in Example 1, which was set as Comparative Example 3.

Regarding the dicing die bonding films prepared in Examples 1 to 3 and Comparative Examples 1 and 2 above, burr incidence, pick-up property and contamination rate of die on working were measured with the following methods.

1. Measurement Test about Burr Incidence, Pick-Up Property and Contamination Rate of Die Cases of Examples 1 to 3 and Comparative Examples 1 and 2

The dicing was performed using the dicing die bonding films prepared in Examples and Comparative Examples. Here, the size of die was 5 mm×5 mm. The dicing was made to a depth of 17 μm, and then burr incidence was observed. Subsequently, the film was expanded to 7 mm to confirm pick-up property.

The above test was repeated 100 times, and burr incidence was calculated about dies, in which burrs were caused, of 100 dies. In case of pick-up property, it was distinguished into defective when even one of 100 dies failed. In addition, after the die bonding film was separated through the expanding process, contamination rate of die due to generation of film powders in cutting the die bonding film was also calculated by the same method as said burr incidence.

Case of Comparative Example 3

When the dicing die bonding film prepared in Example 1 was applied to the dicing process, the dicing was performed to only the die bonding film, all the pressure sensitive adhesive layer and partial base film of the dicing film (30 μm), and the burr incidence was observed. Then, the film was expanded to 7 mm to measure pick-up property. The size of die in dicing was 5 mm×5 mm.

The results measured by the method as shown above were represented in Table 1 below.

TABLE 1

|  | Example | | | Comparative Example | | |
| --- | --- | --- | --- | --- | --- | --- |
|  | 1 | 2 | 3 | 1 | 2 | 3 |
| Tensile Modulus (MPa) | 450 | 900 | 200 | 3000 | 10 | 450 |
| Dicing Depth (μm) | 17 | 17 | 17 | 17 | 17 | 60 |
| Burr Incidence (%) | 0 | 0 | 0 | 0 | 0 | 15 |
| Contamination of Die (%) | 0 | 0 | 0 | 20 | 0 | 0 |
| Pick-up Property | Good | Good | Good | Good | Poor | Good |
| Adhesive property | Good | Good | Excellent | Poor | Excellent | Good |
| Gap Filling Property | Good | Excellent | Good | Good | Poor | Good |
| Reliability | Excellent | Excellent | Excellent | Poor | Good | Good |

As shown in above Table 1, in cases of Examples 1 to 3 that the dicing die bonding film according to the present invention were applied to the method of dicing of the present invention, burr incidence, or thus contamination of die was completely inhibited. On the contrary, in cases of Comparative Examples 1 to 3 that the modulus of the dicing die bonding film was departed from the scope of the present invention or the method of the present invention was not applied even though the dicing die bonding film of the present invention was used, the satisfactory results could not be obtained.

Specifically, in case of Comparative Example 1 that the die bonding film had an excessive modulus, the die was severely contaminated by burrs generated in dicing. In addition, in case of Comparative Example 2 that the die bonding film had a small modulus, burr incidence or contamination of die was not caused, but pick-up property and gap filling property in the die bonding process were outstandingly lowered. Furthermore, in case of Comparative Example 3 that the dicing die bonding film of Example 1 was applied to the known dicing method, pick-up property, adhesive property and gap filling property, and the like were excellently maintained, but it could be confirmed that a large quantity of burrs were caused in the dicing process.

The invention claimed is:

1. A method of dicing using a dicing die bonding film comprising a dicing film, of which an elongation is from 100% to 2,000%, the dicing film comprising a base film and a pressure sensitive adhesive layer formed on said base film; and a single layer of a die bonding film, of which a tensile modulus is 10 to 2,000 MPa at 25° C., the single layer being formed on said dicing film,
the method comprising:
a first step of adhering a wafer in direct contact with the die bonding film;
a second step of carrying out dicing to a depth that the die bonding film is not completely cut; and
a third step of expanding the dicing die bonding film to completely separate the die bonding film.

2. The method according to claim 1, wherein the dicing in the second step is carried out at a level of 50 to 99% of the die bonding film thickness.

3. The method according to claim 1, wherein the dicing in the second step is carried out at a level of 75 to 95% of the die bonding film thickness.

4. The method according to claim 1, wherein the expanding strength in the third step is regulated in a level of 60 to 90% of the yield strength of the base film in the dicing film.

5. The method according to claim 1, wherein the expanding ratio in the third step is controlled beyond the yield elongation of the base film in the dicing film.

6. The method according to claim 5, wherein the expanding ratio in the third step is controlled below the tensile strain at the beginning point that the tensile strength again increases after the yield point in a tensile curve of the base film in the dicing film.

7. A method of dicing using a dicing die bonding film comprising a dicing film, of which an elongation is from 100% to 2,000%, the dicing film comprising a polyolefin film and a pressure sensitive adhesive layer formed on said polyolefin film; and a single layer of a die bonding film, of which a tensile modulus is 10 to 2,000 MPa at 25° C., the single layer being formed on said dicing film,
the method comprising:
a first step of adhering a wafer in direct contact with the die bonding film;
a second step of carrying out wafer dicing to a depth that the die bonding film is not completely cut; and
a third step of expanding the dicing die bonding film to completely separate the die bonding film.

8. The method according to claim 7, wherein the expanding strength in the third step is 600 to 1,350 gf.

9. The method according to claim 7, wherein the expanding ratio in the third step is 8 to 30%.

10. A method of packaging a semiconductor comprising:
(1) a step of picking up a semiconductor chip prepared by carrying out the dicing method of claim 1;
(2) a step of bonding the picked-up semiconductor chip to a substrate for semiconductor;
(3) a step of connecting the semiconductor chip to the substrate for semiconductor with an electric connecting means; and
(4) a step of molding the prepared package with a sealant.

11. A method of packaging a semiconductor comprising:
(1) a step of picking up a semiconductor chip prepared by carrying out the dicing method of claim 7;
(2) a step of bonding the picked-up semiconductor chip to a substrate for semiconductor;
(3) a step of connecting the semiconductor chip to the substrate for semiconductor with an electric connecting means; and
(4) a step of molding the prepared package with a sealant.

* * * * *